(12) United States Patent
Marion et al.

(10) Patent No.: US 8,898,896 B2
(45) Date of Patent: Dec. 2, 2014

(54) METHOD OF MAKING A CONNECTION COMPONENT WITH HOLLOW INSERTS

(75) Inventors: Francois Marion, Saint Martin le Vinoux (FR); Damien Saint-Patrice, Chabeuil (FR)

(73) Assignee: Commissariat a l'Energie Atomique et aux Energies Alternatives, Paris (FR)

( * ) Notice: Subject to any disclaimer, the term of this patent is extended or adjusted under 35 U.S.C. 154(b) by 1137 days.

(21) Appl. No.: 12/866,687

(22) PCT Filed: Feb. 19, 2009

(86) PCT No.: PCT/FR2009/000186
§ 371 (c)(1),
(2), (4) Date: Dec. 3, 2010

(87) PCT Pub. No.: WO2009/115686
PCT Pub. Date: Sep. 24, 2009

(65) Prior Publication Data
US 2011/0094789 A1    Apr. 28, 2011

(30) Foreign Application Priority Data

Feb. 22, 2008 (FR) ..................................... 08 51142

(51) Int. Cl.
  H01K 3/10      (2006.01)
  H01L 23/00     (2006.01)
  H05K 3/34      (2006.01)
(52) U.S. Cl.
  CPC ....... H01L 24/12 (2013.01); H01L 2924/01046 (2013.01); H01L 2924/01019 (2013.01); H01L 24/81 (2013.01); H01L 2924/01074 (2013.01); H01L 2224/81208 (2013.01); H01L 2924/01079 (2013.01); H05K 2201/09472 (2013.01); H01L 2224/116 (2013.01); H01L 2924/01029 (2013.01); H01L 2224/114 (2013.01); H05K 3/3436 (2013.01); H01L 2924/01057 (2013.01); H01L 2924/01327 (2013.01); H01L 24/16 (2013.01); H01L 2924/01022 (2013.01); H01L 2924/01058 (2013.01); H01L 2924/014 (2013.01); H01L 2924/01024 (2013.01); H01L 2224/16237 (2013.01); H01L 2224/13099 (2013.01); H01L 24/11 (2013.01); H01L 2924/01082 (2013.01); H01L 2924/01006 (2013.01); H01L 2924/01078 (2013.01); H01L 2924/0105 (2013.01); H01L 2224/1147 (2013.01); H01L 2224/81801 (2013.01); H01L 2224/81191 (2013.01)
  USPC ................... 29/852; 29/825; 29/830; 29/874; 29/884

(58) Field of Classification Search
  CPC ............................... H05K 7/10; H05K 7/1061
  USPC ................................... 29/825, 830, 846, 884
  See application file for complete search history.

(56) References Cited

U.S. PATENT DOCUMENTS 5,669,774 A * 9/1997 Grabbe .......................... 439/70
6,179,198 B1   1/2001 Eifuku et al.
(Continued)

FOREIGN PATENT DOCUMENTS

EP       0352020 A2    1/1990
WO    WO-2006054005 A1   5/2006

OTHER PUBLICATIONS

European Patent Office, International Search Report dated Nov. 24, 2009 (2 pgs. English Language).

Primary Examiner — Carl Arbes
(74) Attorney, Agent, or Firm — Harris Beach PLLC (57) ABSTRACT

The invention relates to a method for making a connection component that comprises a set of conducting inserts to be electrically connected with another component, said inserts being hollow.

12 Claims, 6 Drawing Sheets

(56) References Cited

U.S. PATENT DOCUMENTS

| | | |
|---|---|---|
| 6,352,436 B1 | 3/2002 | Howard |
| 6,757,972 B1 * | 7/2004 | Farnworth ............... 29/884 |
| 7,015,590 B2 * | 3/2006 | Jeong et al. ............ 257/780 |
| 7,442,045 B1 * | 10/2008 | Di Stefano ............... 439/66 |
| 8,093,728 B2 * | 1/2012 | Marion .................... 257/779 |
| 2004/0197979 A1 | 10/2004 | Jeong et al. |
| 2009/0305523 A1 * | 12/2009 | Di Stefano ............... 439/66 |

\* cited by examiner

PRIOR ART

A/ sacrificial layer thickness e1

Sacrificial layer
Thickness e1

B/

METAL DEPOSITION μTUBE

METHOD OF MAKING A CONNECTION COMPONENT WITH HOLLOW INSERTS

CROSS REFERENCE TO RELATED APPLICATIONS

This application is a National Stage filing under 35 U.S.C. §371 of PCT Application No. PCT/FR2009/000186, filed on Feb. 19, 2009. This application also claims the benefit of French Application No. 0851142, filed Feb. 22, 2008. The entirety of both applications is incorporated herein by reference.

FIELD OF INVENTION

The technical field to which the invention relates is that of microelectronics, and to be more specific that of the manufacture, on semi-conductor component wafers, of hollow-form metal patterns, to advantage bevelled, that facilitate for example the vertical (better known as "flip-chip") connection of two components.

The present invention may be used in all sorts of devices requiring very small pitch metal pattern interconnects, particularly in respect of the manufacture of very large-scale very fine pitch imaging devices.

BACKGROUND OF THE INVENTION

Figure 1:
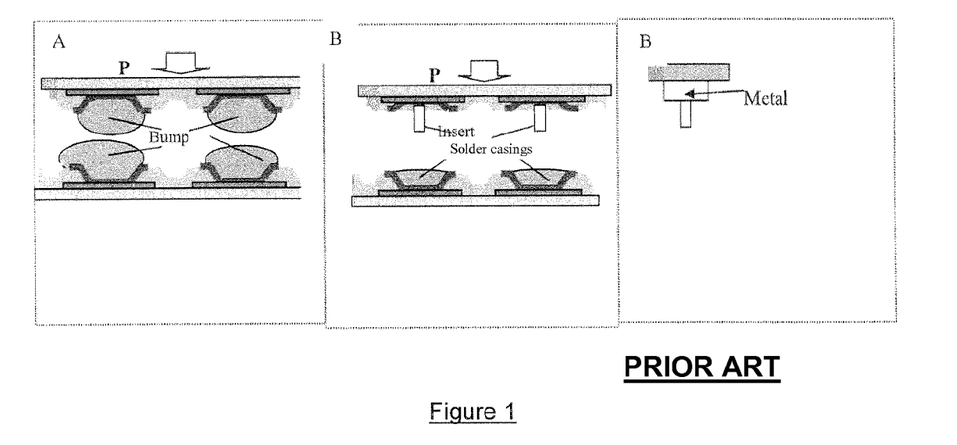
FIG. 1 shows the different substrate-to-chip connection systems according to the prior art.

At the present time, two possibilities are known in the main for assembling, according to the "flip chip by thermocompression" technique, two components requiring a large number of vertical electrical connections with a very fine pitch:

the first thermocompression technique comprises pressing two beads, at temperature, one against the other so as to bind them by plastic deformation (FIG. 1A).

the second technique, developed for the finest interconnect pitches, allows working at a lower temperature than the temperatures used in the first technique: it involves replacing one of the thermocompressed beads by a "hard" protuberance which breaks the native oxide of the solder at low-temperature reducing the support cross-section (FIG. 1B), thereby making it possible:
  to reduce the assembly temperature and assembly pressure;
  to control crushing.

This second technique has been subject to patent application WO2006/054005 and adapted inserts are described in the document U.S. Pat. No. 6,179,198 (FIG. 1B).

The present invention falls within this second technique, known as insertion thermocompression, and aims to resolve the limitations in relation thereto, which are basically two in number.

The first problem relates to the thermocompression forces.

Indeed, the cross-section of the insert in the plane (X,Y) is required to be as low as possible so as to restrict the insertion force.

If the number of columns to be inserted increases, the insertion force to be exerted on the part for assembly is proportionate to the number $\underline{N}$ of connections to be implemented, and to the surface of their cross-section $\underline{S}$, according to the following formula:

$$F_{hyb}=k*S*N$$

This technique is thereby limited in respect of components with a very large number of connections, since it is known for example that a force of 4 tonnes would be needed to hybridize a matrix of 4 million pixels (1 g/bump).

The problem in relation to these forces may be exacerbated owing to the sensitivity of the assembled components.

Some materials for assembly are thus very sensitive to local stresses, leading to the creation of destructive dislocations during thermocompression hybridization.

Alternatively, the forces brought into play are no longer compatible with the required precision of assembly. Indeed, the requisite maximum lateral movement after hybridization must be less than 1 micrometer.

The second major technical problem raised by the insertion thermocompression technique is related to the way the inserts are made.

Indeed, making protuberances in a semi-conductor foundry may become problematic in respect of very fine pitches. If the cross-section of the inserts is reduced, conventional production techniques may prove difficult to implement, given the fineness of the required inserts.

This restriction is therefore related to the concept of a minimum fineness of photolithography. It is thus not possible to reduce the cross-section of a conventional full insert, for a given technological photolithographic resolution D, below the value $\Box *D^2/4$.

DISCLOSURE OF INVENTION

Having analyzed all these specific constraints, the Applicant proposes a particular technical solution which comprises reducing the cross-section of insertion in the solder casings, without however reducing the insert-to-solder contact surface.

In practice, it is therefore a matter of obtaining a component, to advantage a chip, comprising a set of conductive inserts to be electrically connected with another component, said inserts being hollow.

The fact that the full inserts, described in the prior art, are replaced by hollow inserts according to the invention in fact allows the insertion cross-section to be reduced.

According to a first aspect, the present invention therefore relates to a method for making a connection component that comprises hollow conductive inserts to be electrically connected with another component. Characteristically, this method includes the following steps:

depositing a layer of resin on the surface of the component;
making apertures, in the layer, that are adapted to the shape of the inserts;
depositing material or materials constituting inserts along the surface of the layer;
eliminating the material or materials on the upper plane of the layer;
removing the layer.

The first step is therefore the deposition of a so-called sacrificial layer, to advantage made out of resin, whereof the transient function is to act as a matrix for the formation of the inserts and which is removed at the end of the process, to advantage by delaquering.

To advantage and in a second step, the apertures made in the layer are made by photolithography.

According to a preferred embodiment, the material or materials constituting the inserts along the surface of the layer are deposited using thin layer deposition techniques, while their subsequent elimination, on the upper plane of the layer, is implemented by etching.

One advantageous solution, proposed under the present invention, is to make a hollow insert whereof the upper part or free end is cut slantwise, thereby forming a bevel. In other words, the height H varies at different points of the circumference of the insert. In practice and in terms of the method forming the subject matter of the present application, the component is inclined at a defined orientation, either when the material or materials constituting the inserts are deposited, or when they are eliminated.

In a preferred way and in a subsequent step, the internal and external surfaces of the insert are coated with a layer of metal that protects from oxidation, to advantage gold.

At the end of said manufacturing method which is relatively straightforward to implement, a connection component is therefore obtained provided with hollow conductive inserts, capable of being connected to a second component. Owing to this method, said inserts have the special feature of being closed at their base by a mount resting on the surface of the component, said mount being of the same composition as the body of the insert.

To advantage, the inventive hollow inserts are of annular cross-section (in particular round or oval) or parallelepiped (particularly square or rectangular).

To advantage, this cross-section is of thickness $e$, known as skin thickness.

This new form of inserts allows these skins to be manufactured using thin layer deposition techniques derived from the techniques used in the field of microelectronics and no longer, as in the prior art, the technique of photolithography, the drawbacks of which have been mentioned above.

To further illustrate this proposal, the photolithography defines a limited aperture of a resin which will define the cross-section of the future insert. Thus and by way of example, if $D$ is the resolution of photolithoetching technology, it is possible to:

define a hole that can be filled with the material of the insert by electrolytic growth or by "lift off" deposition, the resulting insert having a diameter equal to the minimum diameter of the open hole (minimum D);

deposit a layer of the material of the insert and etch it, this technique also being restricted by the minimum resolution D.

It is quite clear that the "effective" cross-section of an insert according to the prior art is equal to the maximum surface inserted in the casing, i.e. for example in the case of a cylindrically shaped insert of diameter $D$:

$$S = \pi \cdot D^2/4 \text{ with } D: \text{ the photolithographic resolution.}$$

In the context of the invention, for an equivalent insert cross-section, namely an external diameter $D$, and for the same photolithographic resolution, the insertion surface is defined by the following formula:

$$S' = \pi \cdot (D^2 - D0^2)/4 = \pi * 2 * e * 2 * D/4$$

i.e.

$$S' = \pi * e * D$$

wherein e defines the thickness of the skin of the insert and is much less than D.

The ratio of the surfaces S and S', and therefore of the insertion forces F and F', is in the end:

$$F'/F = kS'N/kSN = S'/S$$

i.e. $F'/F = 4*e/D (e << D)$

Furthermore and as already stated, the contact surface must be maintained, or even increased.

In fact, in the inventive configuration, the solder-to-insert contact surface is de facto multiplied by about two, since the external just as much as the internal surfaces of the hollow insert are in electrical contact. On the other hand and in respect of a full insert, only the external surface provides this contact.

To be more precise and to advantage, the protuberance defined in the inventive context comes in the form of a tube or a quadrilateral closed at the base by a mount resting on the component, to advantage a chip.

The inventive hollow insert is made based on metal so that it can perform its electrical conduction function. This is to advantage a material of hardness greater than that of the material into which it will be inserted. For example, it may be copper (Cu), titanium (Ti), tungsten (W), WSi, chromium (Cr) or a multi-layer of these materials. In this case and to advantage, one of the layers acts as a diffusion barrier layer of the material into which it is inserted: for example Ni, Pd, Pt, WN, TiN etc.

In a preferred way and as already stated, the internal and external surfaces of the insert are coated with a layer of metal that protects from oxidation, to advantage gold.

According to one advantageous embodiment, said hollow insert has, as an additional feature, a bevelled upper end.

Upper end is here taken to mean the part located on the opposite side from the end formed by the mount and acting as a support base on the component. The bevelled part therefore corresponds to the one which is engaged in the hybridization with the second component, via its insertion into a connection bump.

Indeed, it has been noted, in the context of the present invention, that inserting hollow protuberances into the bumps might cause pockets of air to get trapped at the bottom of the insert.

A first solution to overcome this drawback is to hybridize in a vacuum.

A second advantageous solution, proposed under the present invention, is to make a hollow insert whereof the upper part or free end is cut slantwise, thereby forming a bevel. In other words, the height H varies at different points of the circumference of the insert.

According to one inventive alternative, the insert is inserted into another insert of the same type as the one previously described, and deposited onto the other component with which the connection is required.

With such a device, a particular hybridization method is implemented:

in a pre-insertion step, the hollow and bevelled inserts carried by the first component are partially inserted into the connection bumps of the second component to be hybridized. This step is carried out with the help of a standard placement machine, comprising no vacuum equipment. It is performed to advantage at ambient temperature;

the final collective insertion is implemented in a vacuum in straightforward pressing equipment, devoid of alignment functions.

More generally and according to another aspect, the invention therefore also relates to a method of hybridization between an inventive component and a second component provided with connection bumps, which includes the following steps:

alignment and partial insertion of the inserts in the bumps, carried out to advantage at ambient temperature;

final insertion, carried out to advantage in a vacuum.

This two phase method makes it possible to avoid using complex and costly machinery and technology.

Furthermore and as already mentioned, the insertion forces brought into play are notably reduced owing to the hollow aspect of the inserts.

BRIEF DESCRIPTION OF THE FIGURES

The way in which the invention may be implemented and the resulting advantages will become clearer from the following embodiment example, given by way of information and non-restrictively, supported by the appended figures wherein.

DETAILED DESCRIPTION OF THE INVENTION

Figure 4:
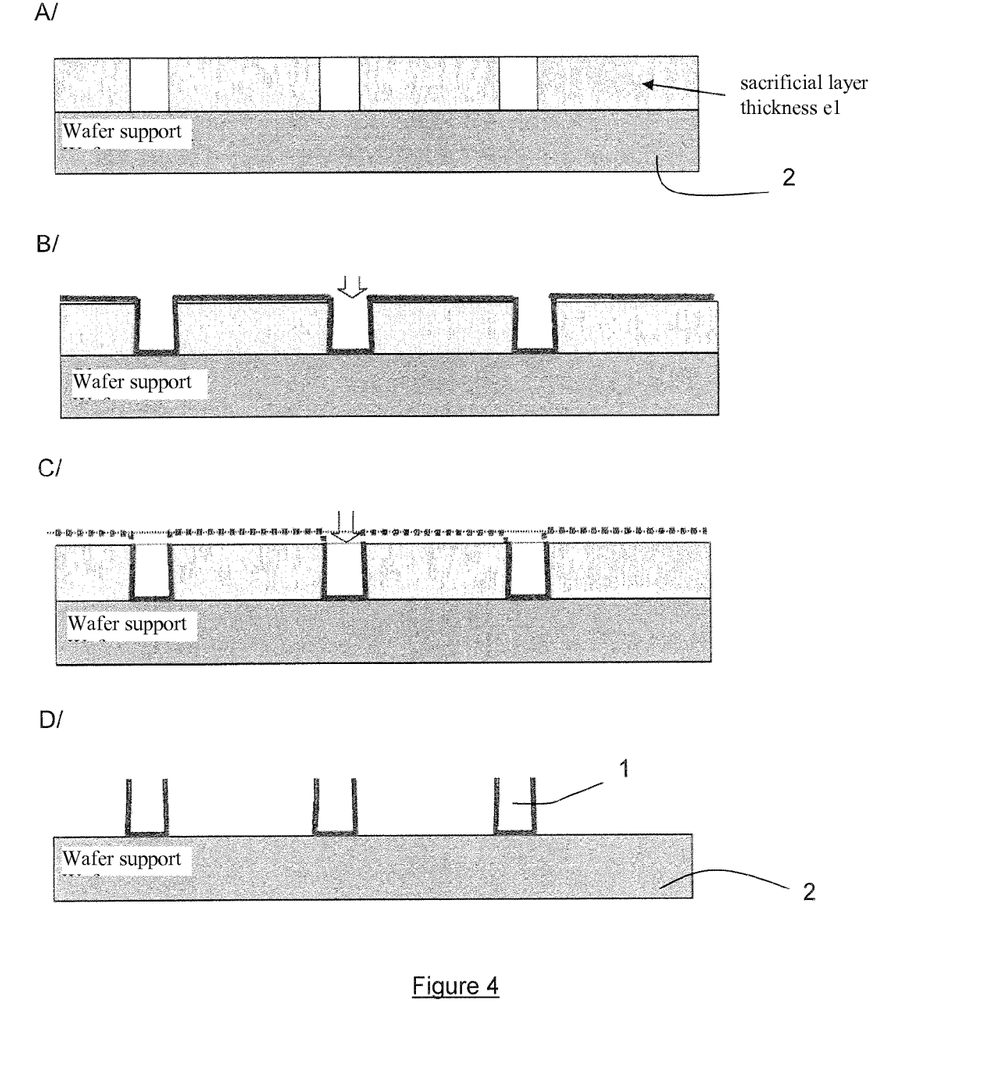
FIG. 4 shows in diagrammatic form the different steps in the manufacture of an inventive component.

A component provided with inserts that have the configuration described under the present invention may be obtained using the method shown in FIG. 4. It is typically a CMOS (Complementary Metal-Oxide Semiconductor) wafer, produced by a silicon foundry.

The first step (FIG. 4A) comprises depositing a so-called "sacrificial" layer of thickness $e_1$ made using a resin. This layer is then subjected to standard photolithography. This step allows apertures of the required diameter to be created for the tubes which will act as inserts. More generally, it is at this step that the future shape of the insert is set (height, aperture shape, etc.).

The second step (FIG. 4B) corresponds to the deposition of metal, possibly a metal multi-layer, matching the tube. It is the thickness of this deposition which will dictate the thickness $e$ of the hollow insert. The metal is to advantage copper, titanium, tungsten, WSi, chromium or a multi-layer of these materials.

The aperture diameters may be controlled at values below 1 micrometer and heights above 3 micrometers.

The thicknesses of the metals can be adjusted and controlled down to values below 0.1 micrometer.

It is possible to modify, or simply to complete the usual metal deposition with an additional layer of a wettable metal, to advantage gold, platinum or copper. The advantage of this is that it facilitates subsequent soldering and the creation of the requisite intermetallic interfaces during the final soldering.

In a preferred embodiment, the hollow insert assumes a final "tube" shape, corresponding to a circular aperture. However, any other shape may be employed by an adapted design of the aperture mask: triangle, square, polygon, etc.

To advantage, the hollow shape may have a cross-section of variable size, and for example be cone- or truncated cone-shaped. This may be achieved merely by playing on the sacrificial resin etch anisotropy.

It is also possible to combine different shapes on a single manufactured wafer and/or on a single chip to be hybridized.

The third step (FIG. 4C) comprises removing the metal layer on the upper plane of the sacrificial resin. Two techniques of etching the upper metal face may be used:

1/ "Damascene Etching" Technique

This step may be carried out in the same way as the damascene etches used in the semi-conductor industry. The upper face of the substrate is mechanically or chemo-mechanically polished, the metal layer and a part of the surface sacrificial layer are removed, the tube part in the aperture only being etched over a small portion of its height.

Figure 5:
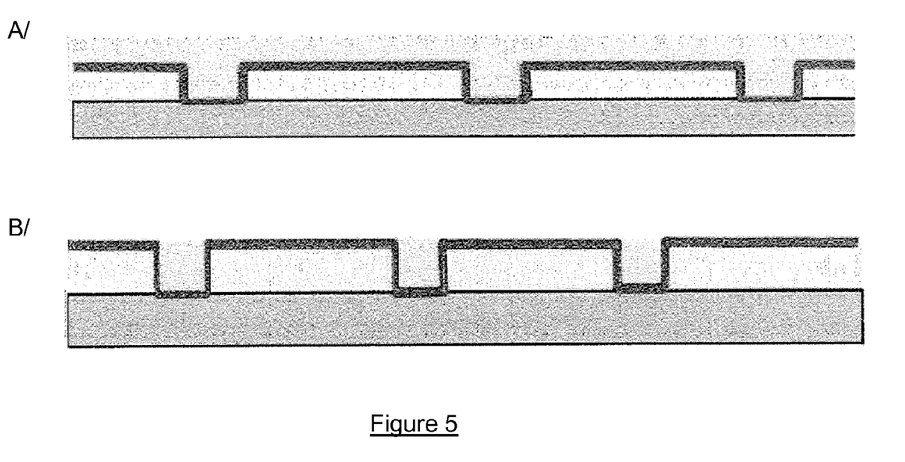
FIG. 5 shows the two additional steps implemented when the gap-fill technique is implemented.

2/ "Gap Fill" Technique (FIG. 5)

The wafer produced in the previous step is covered with a fluid resin which planarizes the entire surface and fills the apertures, as shown in FIG. 5A.

The resin is then etched uniformly on the (full) wafer until the upper metal surface is reached (FIG. 5B). Etch end detection can easily be implemented by optical analysis, residual gas analysis, etc.

FIG. 5B shows that the holes remain filled with resin at the end, because of their great depth and of the good control of the full wafer etched resin thickness.

This configuration is that produced at the end of a conventional masking: a standard etch may be applied to the metal "showing on the surface", the metal at the bottom of the aperture still being protected by the filling resin.

A final delacquering of the resin still present at the bottom of the apertures is then carried out.

The final step (FIG. 4D) is the removal of the sacrificial layer. This is a fully understood step known as delacquering.

At the end of this process, it is possible to complete the internal and external finishing of the inserts by an "electroless" deposition, which guarantees a subsequent non-oxidation of the surface of the metal of the insert. Gold is preferably used in this step. It should be noted that so-called "electroless" gold grows on the exposed metal zones of the inserts via the "chemical" deposition effect known to those skilled in the art.

Thus and by way of example, since it is known that the photolithographic resolution of a semi-conductor plant is 3 micrometers, for a resin thickness of 4 micrometers, it is possible to make tubes that have the following dimensions:

height (H)=3 µm;
diameter (D)=3 µm;
pitch=5 µm;
thickness of skin (e=deposited thin layer metal thickness)=150 nm (Ti+TiN+Au).

Figure 2:
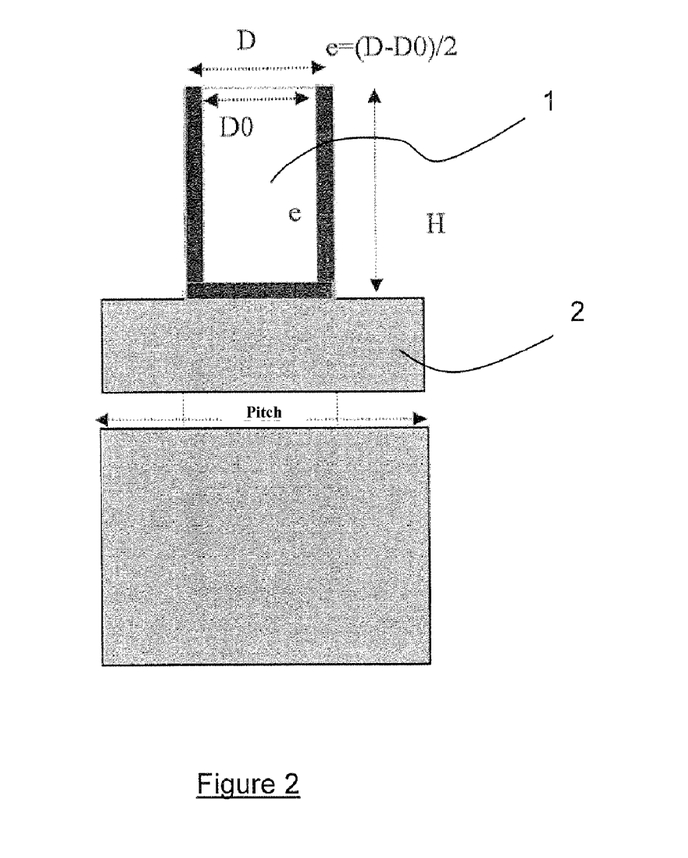
FIG. 2 shows in diagrammatic form a cross-section view of an inventive hollow insert resting, via a mount, on the component.

A component provided with such an insert is shown in FIG. 2.

It is possible to calculate the insertion force gain relative to a cylindrical insert of the same diameter:

$$F'/F = 4*e/D = 4*0.15/3 = 0.2.$$

The insertion force per insert is then divided by 5, compared with a conventional insert of the "full cylinder" type. In other words, it is possible to multiply the number of connections by 5, at equal thermocompression force.

Figure 3:
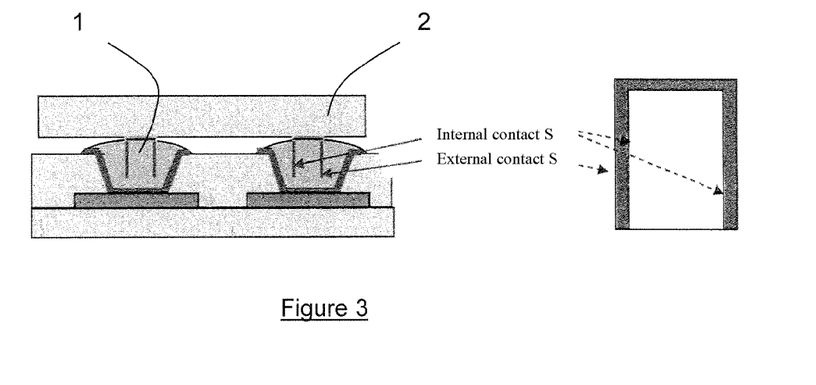
FIG. 3 shows in diagrammatic form the hybridization of two components via the insertion of an inventive hollow protuberance in the corresponding ductile casing and shows the increase in the contact surface.

FIG. 3 shows, additionally, the increase in contact surface which occurs both via the external surfaces of the insert, but also via its internal surfaces.

Figure 6:
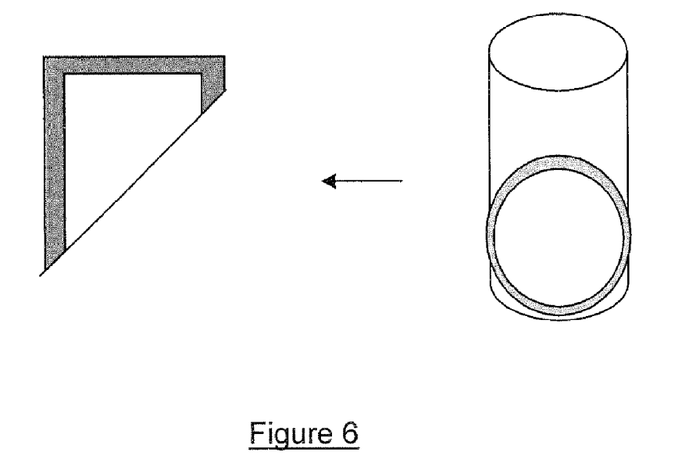
FIG. 6 shows in diagrammatic form a cross-section view of an inventive hollow bevelled insert.

According to a second embodiment, the hollow insert is bevelled in its upper part, as shown in FIG. 6.

Two methods, derived from the one described above, can be used to obtain said bevel.

1/ Bevel Manufacture by Etching

Figure 7:
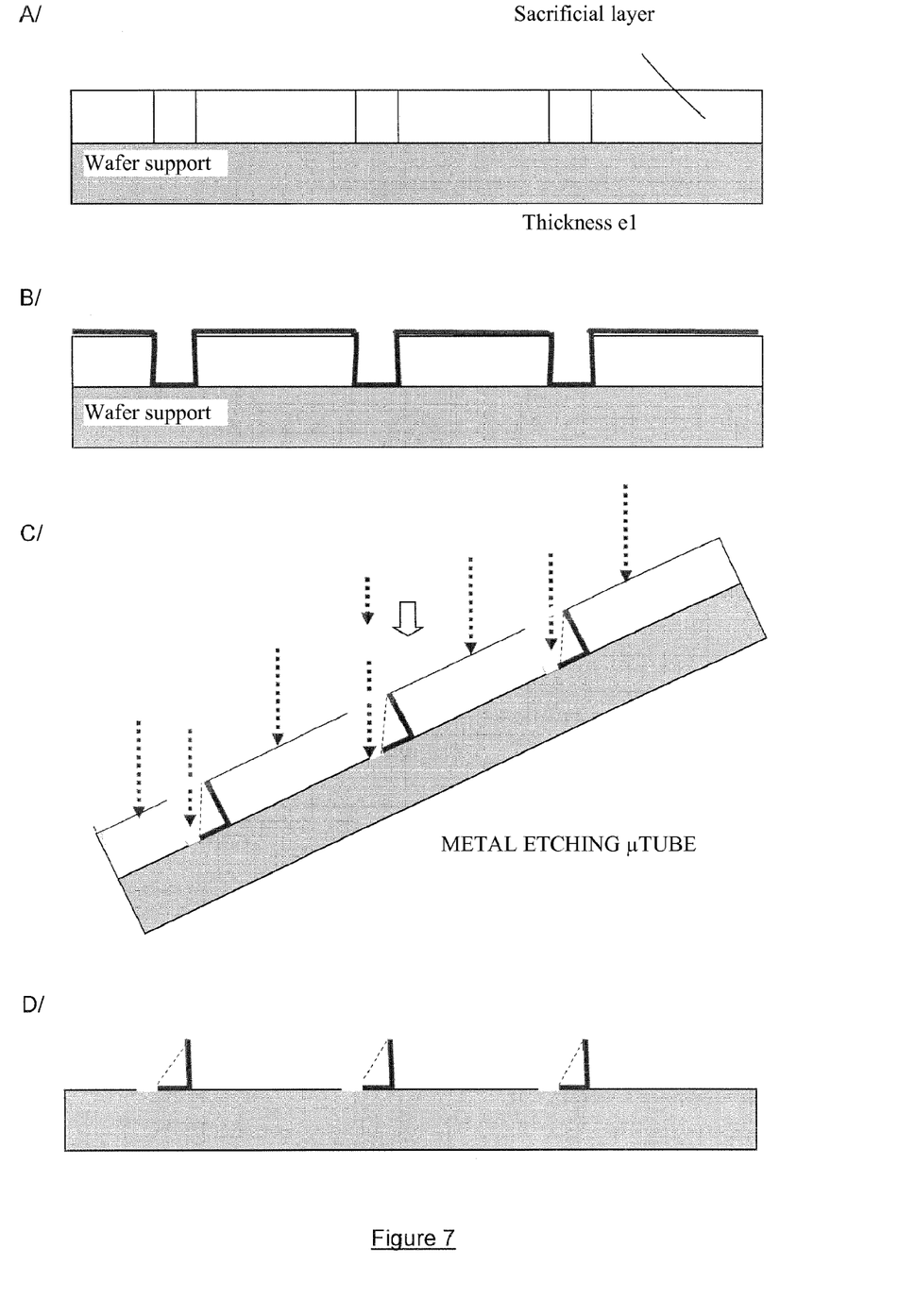
FIG. 7 shows in diagrammatic form a first mode of manufacturing components provided with inventive hollow bevelled inserts.

The first and second steps occur as described above (FIGS. 7A and 7B).

On the other hand, the method is modified during the step of removing the metal layer, the layer located on the upper plane and on the side. This step is carried out by "ion milling" etching (or directive RIE etching) or any other "directional" etching.

In practice, the wafer support is inclined by a controlled angle relative to the etch angle.

Thus and as shown in FIG. 7C, the metal on the surface and the metal in the hole, but not hidden by its side, are etched.

The metal of the hole "in the shadow" of the etch cone is retained. For example, where ion milling is involved, it does not see the etching ion beam.

It is the wafer-to-etch direction angle that defines the bevel.

The sacrificial layer is then removed in a conventional way to give the configuration shown in FIG. 7D.

2/ Bevel Manufacture by Deposition

Figure 8:
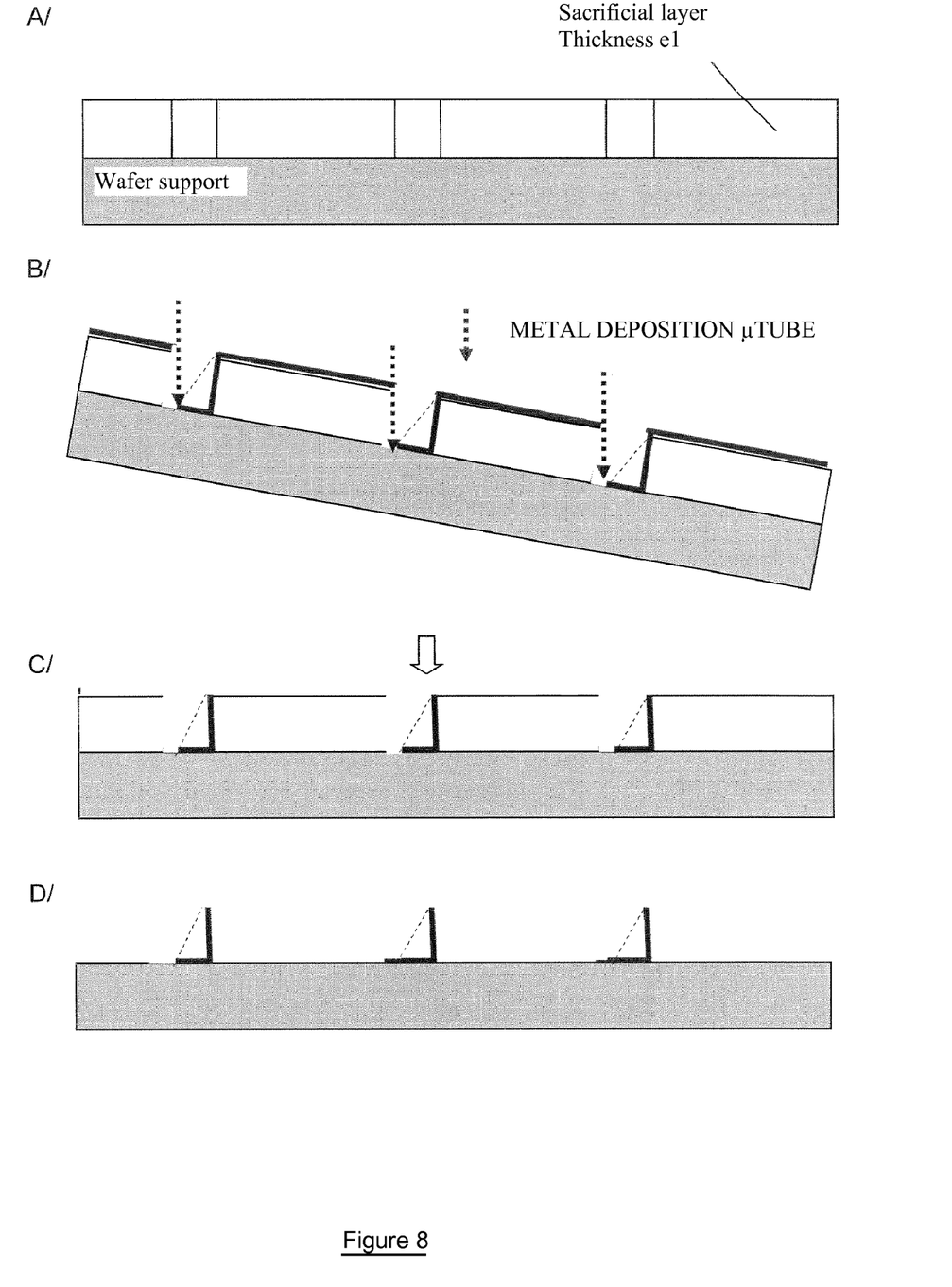
FIG. 8 shows in diagrammatic form a second mode of manufacturing components provided with inventive hollow bevelled inserts.

The first step remains unchanged (FIG. 8A).

On the other hand, during deposition of the metal (or metal multi-layer), the wafer support is inclined by a controlled angle relative to the metal source emission angle (FIG. 8B). Sputtering or vapour deposition is carried out. In fact, the part of the hole "in the shadow" of the deposition cone sees no deposition.

The wafer-to-deposition direction angle defines the bevel.

In the next step (FIG. 8C), the metal layer on the upper plane is removed by photolithography, by damascene CMP method, or "gap fill" method as described above.

Finally, in a final step (FIG. 8D), the sacrificial layer is removed.

This particular configuration of the inserts can be used to hybridize the two components to be electrically and mechanically connected, while preventing any air bubble formation.

Figure 9:
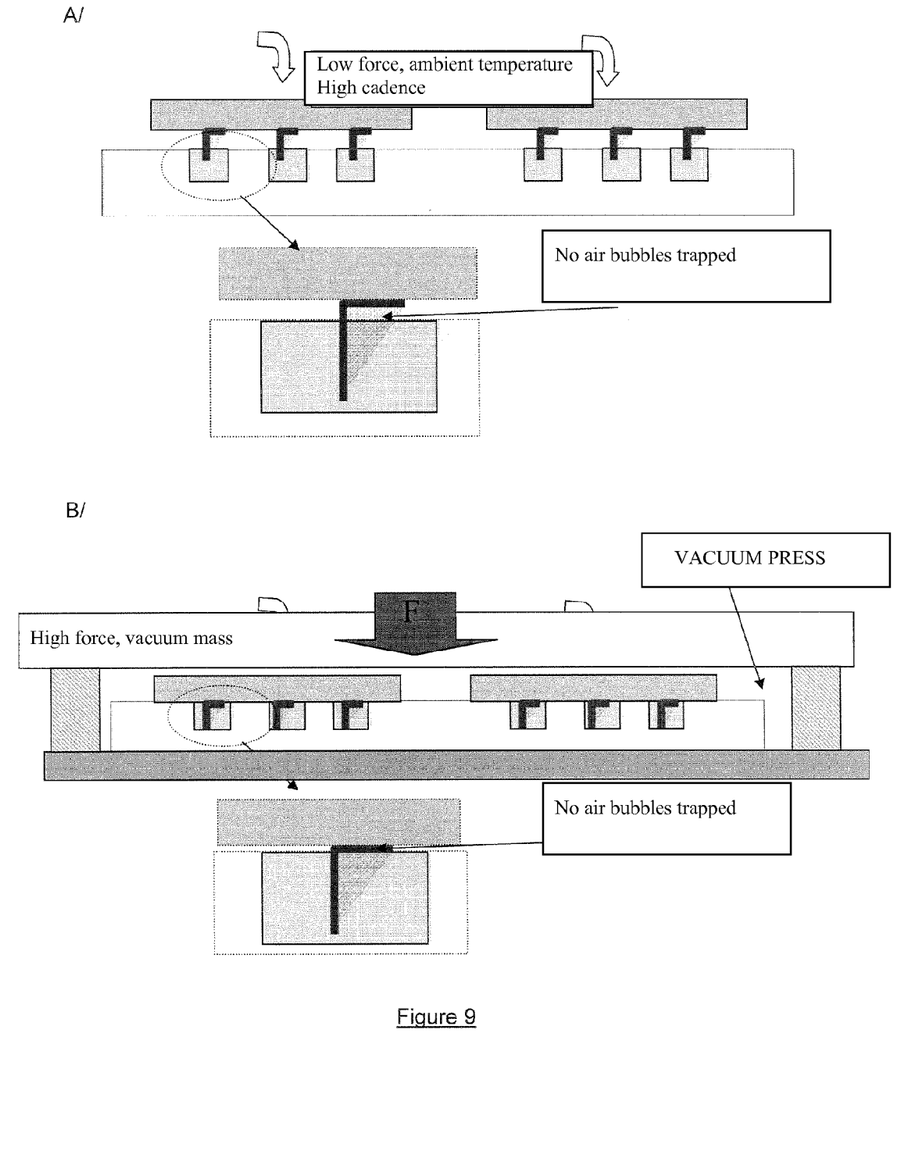
FIG. 9 shows in detail the hybridization method in the case of a component provided with hollow bevelled inserts.

Said method can be broken down into two steps:

1/ Accurate, Fast, Low Force Pre-Positioning (FIG. 9A)

Initially, it is a matter of positioning all the chips for assembly, by low force pre-insertion of the bevelled tubes, in the solder bumps present on a face of the second component, namely the substrate.

This operation may be performed at ambient temperature and in a standard atmosphere.

The chips for assembly are made interdependent with the mother wafer (substrate) by C2W/"chip to wafer" assembly (multihybridization of a plurality of chips on one and the same wafer). The insertion force is calculated so that the tubes are only partially inserted in order to leave room for a subsequent degassing.

2/ Final Large Force Vacuum Insertion (FIG. 9B)

The wafer on which pre-inserted circuits are arranged is then subjected to a large insertion force, in a vacuum, in order to allow the hollow bevelled inserts to be fully inserted into the corresponding connection bumps.

The advantages of the present invention will become clear from the present application.

It can be used to make hybridizations by insertion with very small insertion forces and a significantly increased (doubled) contact surface relative to a conventional insert.

Very high aspect ratio inserts can thus be made with very fine interconnect pitches, using fully mastered technologies from the semi-conductor industry.

The proposed solution thus makes it possible to multiply the number of hybridized points with constant insertion force, while at the same time improving pixel access resistance (by a factor of 2 for the same photolithographic resolution). Additionally, the bevelled inserts remove any risk of air bubbles forming in the connection during hybridization.

This form of insert may also be used for the component to be connected. Indeed, there are three connection types:
- the insert is inserted into a buried zone of the other component;
- the insert is inserted into a protuberance on the surface of the other component;
- the insert is inserted into a hollow protuberance of similar shape to its own. The respective diameters have then only to be suitable: the internal diameter of the protuberance is larger than the external diameter of the insert, or vice versa, but the respective diameters being however sufficiently close to ensure contact, in particular after the forcible insertion of the insert into the protuberance.

To avoid the risk of the inserts being destroyed on account of this mode of insertion, it is advantageous to apply standard mechanical assembly principles. In fact, complementary shapes will be preferred of the cone-to-cone, cone-to-inverted cone, cone-to-tube type. The assembly may thus be reversible (connection/disconnection).

The present invention can be used in a number of ways, in particular:
- for large-scale heterogeneous detection matrices, with a great number of connections by insertion (cooled IRC-MOS, CMT, X-ray sensors, etc.);
- for "cold" hybridized temperature-sensitive matrices;
- for matrices sensitive to mechanical stress.

The invention claimed is:

1. A method for making a connection component comprising a face and cylindrical hollow conducting inserts located on said face to be electrically connected with a second connection component, including the following steps:
depositing a layer of resin on the face of the component;
making cylindrical apertures, in said layer, that are adapted to the shape of the inserts;
depositing the material or materials constituting the inserts along the surface of the layer, for the purpose of forming simultaneously the body and the plinth of the inserts;
eliminating the material or materials on the upper plane of the layer; and
removing the layer.

2. The method for making a connection component as claimed in claim 1, wherein said step of depositing the material or materials constituting the inserts comprises the step of depositing a metal layer follow by depositing an additional wettable metal layer.

3. The method for making a connection component as claimed in claim 1, wherein the apertures in the resin layer are made by photolithography.

4. The method for making a connection component as claimed in claim 1, wherein the material or materials constituting the inserts is deposited along the surface of the layer by means of thin layer deposition techniques.

5. The method for making a connection component as claimed in claim 1, wherein the materials or materials are eliminated on the upper plane of the layer by etching.

6. The method for making a connection component as claimed in claim 1, wherein the layer is removed by delacquering.

7. The method for making a connection component as claimed in claim 1, wherein the connection component is inclined at a defined orientation, during the deposition of the material or materials constituting the inserts or during the elimination thereof, so as to make inserts that have a bevelled free end.

8. The method for making a connection component as claimed in claim 1, wherein in a subsequent step, a layer of non-oxidizable material, to advantage gold, is deposited on the surface of the inserts.

9. A hybridization method between a connection component and a second component comprising the steps of:
provoking a connection component having a face and cylindrical hollow conducting inserts located on said face and a second connection component comprising a face and connection bumps located on said face of the second connection component, wherein each insert is closed at its base by a mount resting on the surface of the connection component, said mount having the same composition as the body of the insert;
aligning and partially inserting the cylindrical hollow conducting inserts in the bumps, at ambient temperature; and
finally inserting said cylindrical hollow conducting inserts into said bumps, in a vacuum.

10. Hybridization method between a connection component comprising:
providing a connection component having a face and cylindrical hollow conducting inserts located on said face and a second connection component comprising a face and connection bumps located on said face of the second connection component, wherein each insert is of annular cross-section, in particular round or oval, or parallelepiped, particularly square or rectangular;
aligning and partially inserting said cylindrical hollow conducting inserts in the bumps at ambient temperature; finally inserting of said cylindrical hollow conducting inserts in the bumps, carried out in a vacuum.

11. Hybridization method between a connection component comprising:
providing a connection component having a face and cylindrical hollow conducting inserts located on said face and a second connection component comprising a face and connection bumps located on said face of the second connection component, wherein each insert has a diameter D and a thickness e, e being much smaller than D;
aligning and partially inserting said cylindrical hollow conducting inserts in the bumps; and
finally inserting said cylindrical hollow conducting inserts in a vacuum.

12. Hybridization method between a connection component comprising:
providing a connection component having a face and cylindrical hollow conducting inserts located on said face and a second connection component comprising a face and connection bumps located on said face of the second connection component, wherein the material or materials constituting each insert are selected from the group comprising: Cu, Ti, W, WSi, Cr, Ni, Pd, Pt, WN, TiN;
aligning and partially inserting said cylindrical hollow conducting inserts in the bumps; and
finally inserting said cylindrical hollow conducting inserts in a vacuum.

\* \* \* \* \*